US007005346B2

(12) United States Patent  
Manger

(10) Patent No.: US 7,005,346 B2  
(45) Date of Patent: Feb. 28, 2006

(54) METHOD FOR PRODUCING A MEMORY CELL OF A MEMORY CELL FIELD IN A SEMICONDUCTOR MEMORY

(75) Inventor: Dirk Manger, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/850,960

(22) Filed: May 21, 2004

(65) Prior Publication Data

US 2005/0032309 A1 Feb. 10, 2005

Related U.S. Application Data

(63) Continuation of application No. PCT/DE02/04287, filed on Nov. 21, 2002.

(30) Foreign Application Priority Data

Nov. 22, 2001 (DE) .............................. 101 57 179

(51) Int. Cl.  
*H01L 21/336* (2006.01)
(52) U.S. Cl. ....................... 438/257; 438/268
(58) Field of Classification Search ................ 438/206, 438/212, 242, 243, 246, 257, 258, 268  
See application file for complete search history.

(56) References Cited

U.S. PATENT DOCUMENTS

| 5,907,170 | A | 5/1999 | Forbes et al. |
| 6,156,604 | A | 12/2000 | Forbes et al. |
| 6,165,836 | A | 12/2000 | Forbes et al. |
| 6,503,813 | B1 * | 1/2003 | Koburger, III ............... 438/424 |
| 6,638,812 | B1 * | 10/2003 | Schlosser et al. ........... 438/243 |
| 2001/0000918 | A1 | 5/2001 | Forbes et al. |
| 2001/0001722 | A1 | 5/2001 | Forbes et al. |
| 2002/0053889 | A1 | 5/2002 | Forbes et al. |

FOREIGN PATENT DOCUMENTS

DE  101 11 760 A1  10/2002

* cited by examiner

Primary Examiner—Phuc T. Dang  
(74) Attorney, Agent, or Firm—Slater & Matsil, L.L.P.

(57) ABSTRACT

A memory cell has a vertical construction of a capacitor and a vertical FET arranged above the latter which can be produced with a lower outlay and in a technologically more reliable fashion. This is achieved by virtue of the fact that two first trenches running parallel and having a first depth are etched in the semiconductor substrate. Between the trenches is formed a web, which is connected to the semiconductor substrate at its narrow sides and which is severed at its underside and is separated from the semiconductor substrate. The suspended web is then provided with a closed dielectric. After a filling, the FET is applied and connected to the web as memory node.

20 Claims, 8 Drawing Sheets

FIG 5A
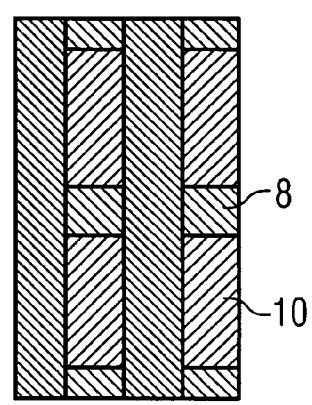
FIG 5B
FIG 5C
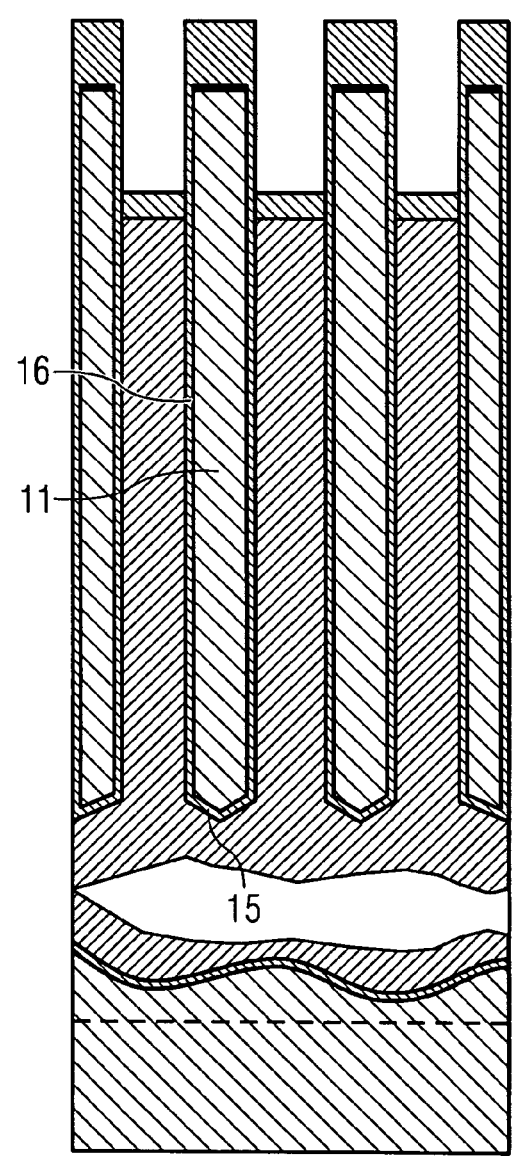
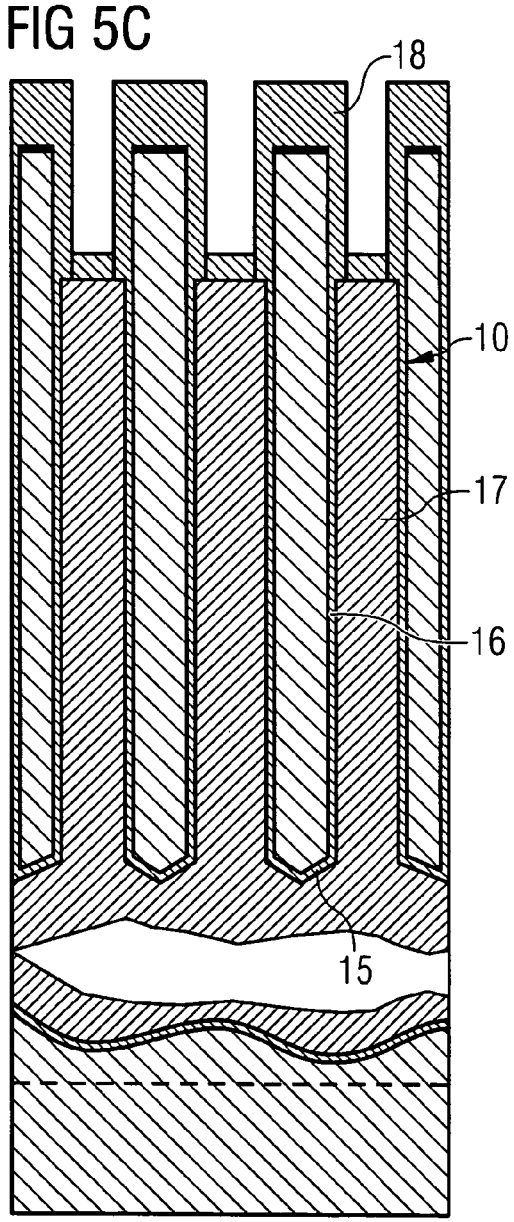

METHOD FOR PRODUCING A MEMORY CELL OF A MEMORY CELL FIELD IN A SEMICONDUCTOR MEMORY

This application is a continuation of co-pending International Application No. PCT/DE02/04287, filed on Nov. 21, 2002, entitled "Method for Producing a Memory Cell of a Memory Cell Field in a Semiconductor Memory" and published on Jun. 5, 2003 as International Publication No. WO 03/046920 A2, which is based on German Application No. 101 57 179.8, filed Nov. 22, 2001, both of which applications are hereby incorporated herein by reference.

TECHNICAL FIELD

The present invention relates generally to semiconductor devices, and more particularly to a method for producing a memory cell of a memory cell field in a semiconductor memory.

BACKGROUND

Memory cells, which are used for example in so-called DRAMs (Dynamic Random Access Memories) have a capacitor, which can store a bit by virtue of its charge. For reading and writing the information in the memory that is for introducing or interrogating a charge in the capacitor, use is made of a field-effect transistor (FET) which is connected to a word line by the gate conductor (GC) and to a bit line by a second source-drain junction. The semiconductor memory then comprises a multiplicity of these memory cells, which can then be addressed via word and bit lines.

In the constant endeavors to reduce the structure widths in order to attain an increase in the packing density in the semiconductor wafers, the intention also is to reduce the geometrical extents of memory cells. For this reason, such memory cells can be constructed vertically in a semiconductor substrate, i.e., the capacitor, in particular, can be introduced into the depth of the substrate and the FET can be constructed vertically and arranged above the capacitor.

German patent application 101 11 760.4 describes a method for fabricating a memory cell of a semiconductor memory in which a trench is etched into a substrate having a semiconductor layer. This is done in such a way that a web remains, which is surrounded by the trench. The dielectric of the capacitor is then applied on the sidewall of the web. The trench is subsequently provided with a trench filling which then serves as a common capacitor electrode of adjacent memory cells. The structure of the FET is then realized on the top side of the web.

In this method, it is necessary to use crossed lines during the lithography in order to produce the webs. This constitutes a critical process step, which can only be realized with difficulty in the case of the present-day prior art.

The depth of the trench etching is stopped by the insulation layer when using an SOI substrate (silicon on insulator material). The insulation is necessary in order to terminate the memory node at its underside. Such a substrate uses predoped wafers (n+ doped), which are usually produced by the epitaxial growth of undoped silicon on doped silicon. An entrainment of dopant into the upper layers, intended as an undoped region, is caused in the process. This will flatten the profile of the lower source-drain junction, which leads to a poor current yield of the FET. Even if the entrainment of the dopant were not taken into account, this source-drain junction is nonetheless subjected to all the heat treatment steps of the process flow, which will lead to a flattening of the profile and to further power losses.

In this known method, free-standing silicon webs are produced which, in practice, must have an aspect ratio of approximately 90 in order to obtain a capacitor with sufficient capacitance. Such a structure is mechanically unstable during wet cleaning and heat treatment processes, such as e.g., when cleaning the side areas after etching and annealing possible etching damage.

Since individual webs surrounded by the trench are formed in this method, a memory cell realized in this way initially also has no direct connection to a continuous word line of the memory. The connection between the gate and a word line is effected in a self-aligned manner with the bit line. However, in the case of lithographic superposition tolerances of typically 0.4 F, where F is the minimum feature size which can be produced lithographically, as has to be assumed in functional concepts, this can lead to short circuits between the word line and the upper source-drain junction.

SUMMARY OF THE INVENTION

The invention relates to a method for fabricating a memory cell of a memory cell array in a semiconductor memory, in which a capacitor with one electrode as memory cell node and a second electrode as common counterelectrode of the memory cell array is formed in a semiconductor substrate and then a field-effect transistor (FET) is produced above the capacitor, which transistor is connected to the memory cell node of the capacitor, to a word line and to a bit line.

In one aspect, the invention provides a memory cell having a vertical construction of the capacitor and a vertical FET arranged above the latter and that can be produced with a lower outlay and in a technologically more reliable fashion.

In the preferred embodiment, the invention includes two first trenches running parallel and having a first depth that are etched in the semiconductor substrate. A web is located between the trenches and is preferably made of the material of the semiconductor substrate with two long sides that run perpendicularly to the substrate surface. The web is connected at least indirectly to the semiconductor substrate at its narrow sides located between the long sides. In this case, indirectly means that the semiconductor substrate is connected to the semiconductor substrate via a means, e.g., via insulating intermediate layers, or directly (without intermediate layers). Afterward the web is severed at its underside and separated from the semiconductor substrate. The web is thus freely suspended from the semiconductor substrate by the narrow sides. Consequently, it becomes possible for the web to be provided with a closed dielectric at its two long sides and at its now free underside. Afterward the trenches are filled with semiconductor material. The FET is subsequently applied at the top side of the web or above the web and is connected to the web as memory node. The word and bit lines are then applied with the FET being contact-connected. It is important for the further function of the memory element that no charge can flow away from the memory node into the semiconductor substrate. For this purpose, the web is electrically insulated from the semiconductor substrate at its narrow sides. This is done before one of the above-mentioned process steps, i.e., at least before the application of the word and/or bit lines.

This method makes it possible, in a departure from all previously customary methods, to use a web from which the memory node is fabricated. The web, in contrast to the known use of a web, is mechanically stable during the fabrication process. It is also possible to avoid the use of SOI substrates since the web, as a result of the uncovering of the underside, can be provided with an electrically insulating dielectric. The first depth and the width of the web between its narrow sides make it possible to provide a sufficient capacitance for the memory behavior of the memory cell.

In a favorable refinement of the method according to the invention, it is provided that the FET is applied to the web as a vertical FET. A consistently vertical construction is thus realized in which it is possible to minimize the required area on the surface of the semiconductor substrate, as a result of which a higher packing density can be achieved.

A further refinement of the method according to the invention provides for the electrical insulation of the web at the narrow sides to be fabricated by etching, transversely with respect to the first trenches, second trenches, which form the narrow sides of the web, with a second depth, which are provided with an electrically insulating layer at least at the narrow side of the web and are subsequently filled, the second depth being at least equal to the first depth. The insulating layer applied at least to the end sides prevents charges from being able to flow away from the memory node into the semiconductor substrate via the end sides. This insulation completes the capacitor with the web as the electrode forming the memory node.

The second depth is expediently deeper than the first depth. This increases the reliability of the "denseness" of the dielectric around the memory node since the insulating layer can be introduced at the narrow sides reliably as far as the underside of the web.

In principle, it is possible to introduce the second trenches when the underside of the web has not yet been severed or the web is held by a filling in the first trenches, that is to say it is still held at some side or another. From a technological standpoint, however, it is favorable to introduce the second trenches before the etching of the first trenches.

In a preferred embodiment of the method, it is particularly the case that the semiconductor substrate is composed of silicon since the latter is the semiconductor material that is used most often at the present time.

A further embodiment of the method according to the invention is characterized in that, after the etching of the second trenches, the areas of the second trenches are provided with a silicon oxide layer that is thin relative to the width of the second trenches, and the second trenches are subsequently filled with a doped polysilicon. Silicon oxide on the one hand constitutes the insulating layer, which is reliably present also at the end sides of the web if all of the second trenches are provided with the layer made of silicon oxide. On the other hand, the silicon oxide constitutes a protective layer, a so-called liner, for the trench filling in subsequent processes and acts, if appropriate, as an etching stop layer.

In a further embodiment of the method according to the invention, it is expedient that, after the etching of the first trenches, silicon oxide is deposited on the inner sides thereof, which silicon oxide is subsequently removed again in the lower region of the first trenches and then an etching operation is performed which undercuts the first trenches in the region of the removed silicon oxide layer and connects the first trenches to one another below the web. In this case, too, the silicon oxide again acts as a liner which makes it possible, through its opening at the underside of the first trenches, to perform an etching in a targeted manner precisely at that point and, consequently, to undercut the web.

BRIEF DESCRIPTION OF THE DRAWINGS

The invention will be explained in more detail below using an exemplary embodiment. In the associated drawings, in FIGS. 1 to 8:

FIGS. 1a to 8a show plan views of a detail from a memory cell array with memory cells fabricated according to the invention in process steps that follow one another; and FIGS. 1b, 2b, 3b, 3c, 4b, 4c, 5b, 5c, 6b, 6c, 7b, 7c, 8b and 8c show sectional illustrations through the detail from the memory cell array along the section lines respectively illustrated in the associated Figures a.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A method of forming a device of a preferred embodiment will now be described with respect to FIGS. 1–8. Each Figure includes a plan view and at least one sectional view.

Figure 1A:
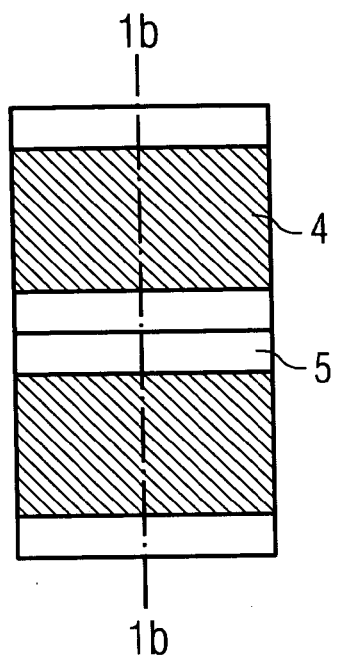
Figure 1B:
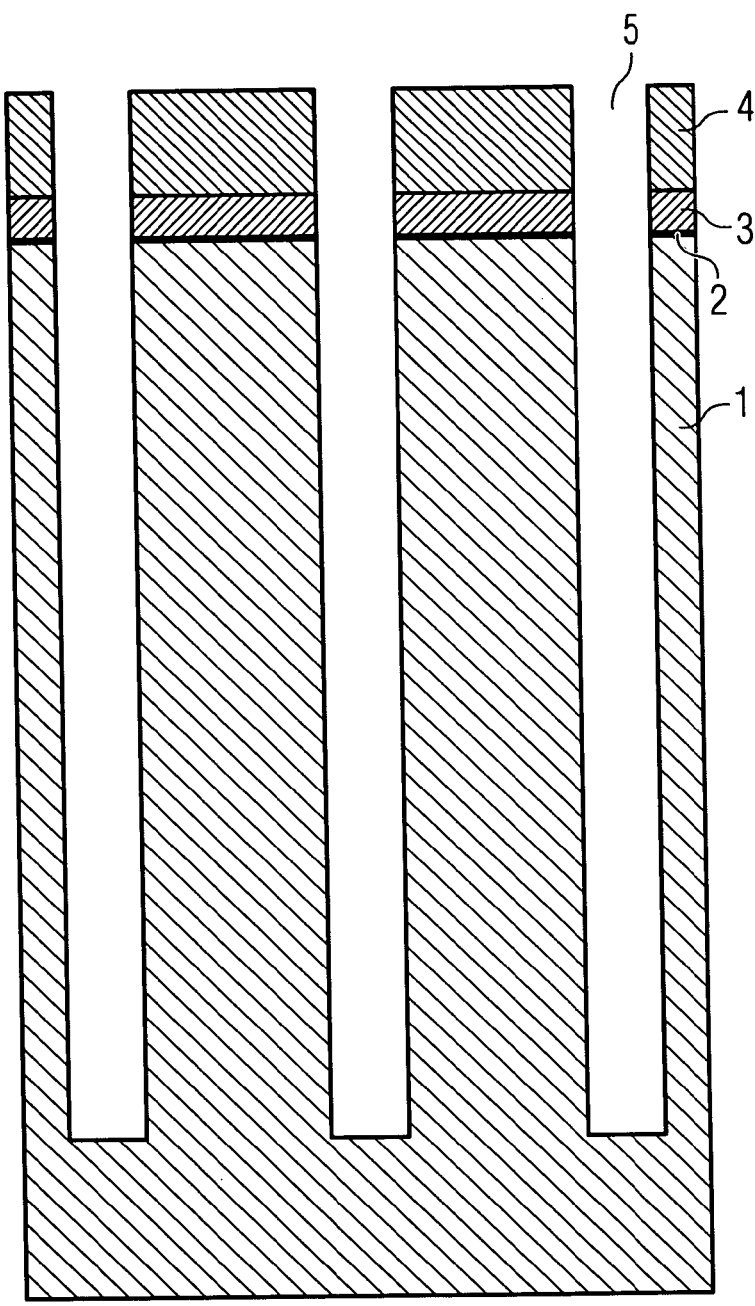

Reference will be made to FIGS. 1a and 1b. For the method according to the invention, a customary pad oxide 2, a pad nitride 3 and a first hard mask 4 made of BSG (borosilicate glass) are applied to a semiconductor substrate 1 made of silicon.

In the method described in this exemplary embodiment, the trenches designated as second trenches 5 in the claims are etched first, and so these second trenches 5 are mentioned first for reasons of uniformity of the terms.

As illustrated in FIG. 1, second trenches 5 are introduced into the semiconductor substrate 1 by means of a first strip lithography step. The first hard mask 4 is removed in the region of the second trenches 5 to be produced and anisotropic etching is subsequently effected.

Figure 2A:
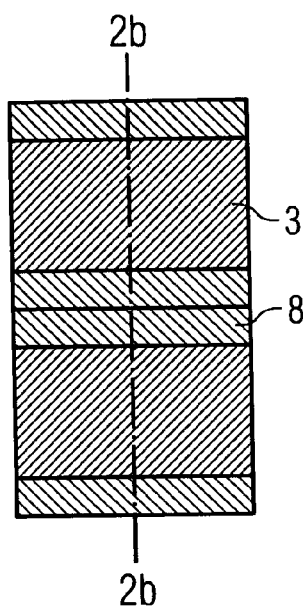
Figure 2B:
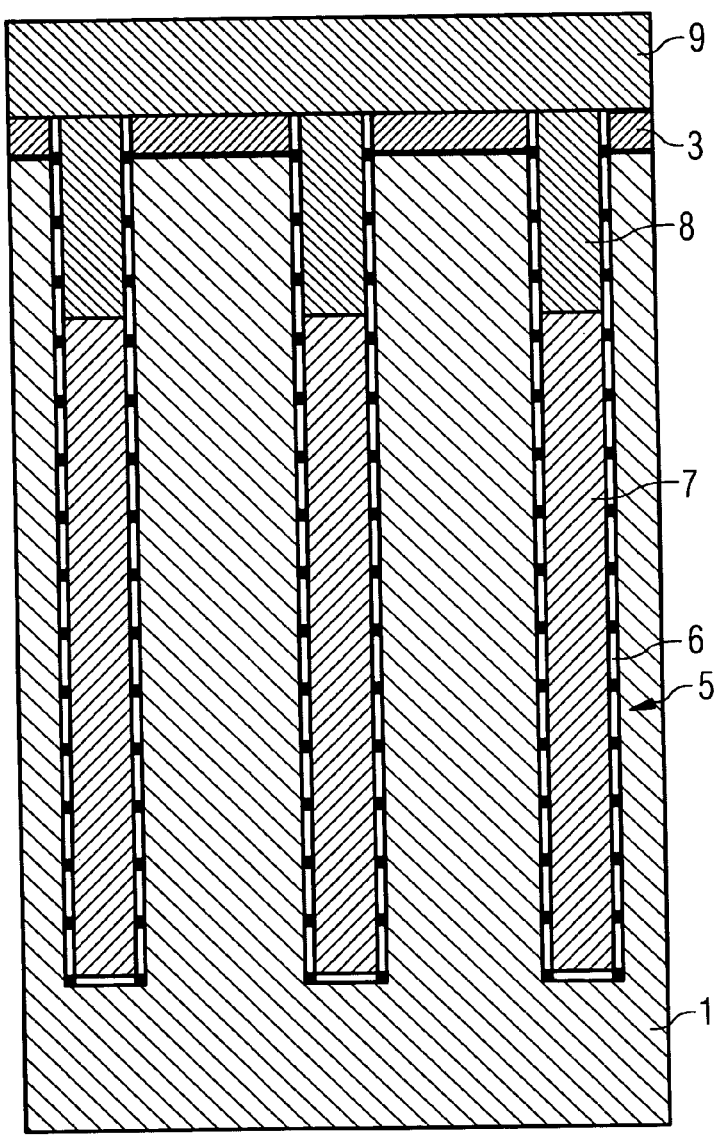

As illustrated in FIG. 2, the first hard mask 4 is removed and the second trenches 5 are subsequently provided with a first liner 6 made of silicon oxide on their areas and are subsequently filled with doped polysilicon 7. After an etching-back of the polysilicon 7, the second trenches 5 are filled with a silicon oxide 8 at the top. A second hard mask 9 is subsequently applied.

Figure 3A:
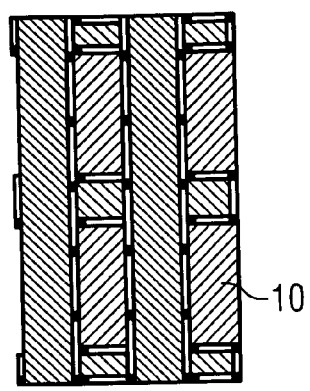
Figure 3B:
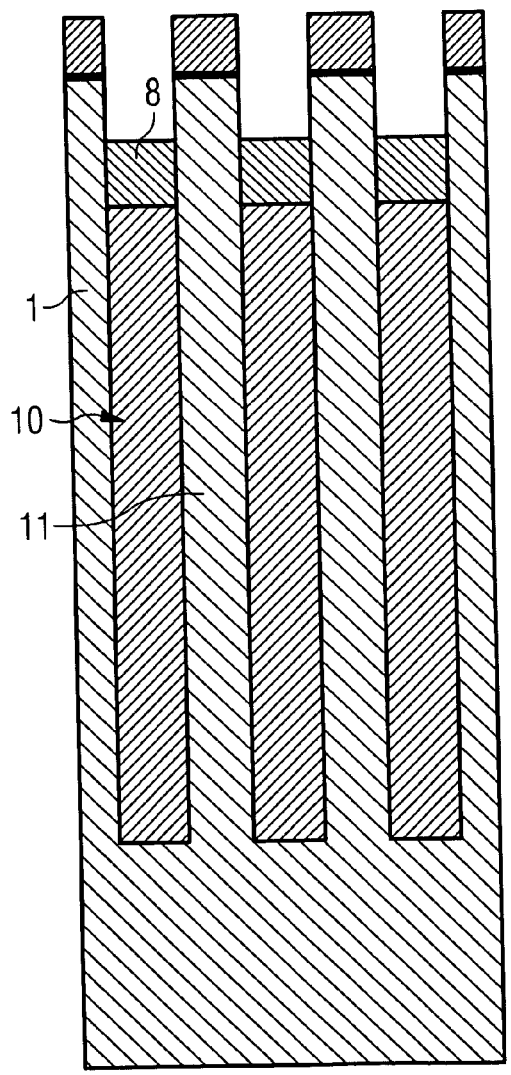

As illustrated in FIG. 3, first trenches 10 are then introduced into the semiconductor substrate 1 transversely with respect to the now closed second trenches 5 by means of a second strip lithography step. The second hard mask 9 is removed orthogonally transversely with respect to the first strip lithography step in the region of the second trenches 5 to be produced and anisotropic etching is subsequently effected. Webs 11 are thus produced. In this case, the silicon oxide 8 on the second trench 5 and the first liner 6 prevents an attack on the doped polysilicon 7 in the second trenches 5.

Figure 3C:
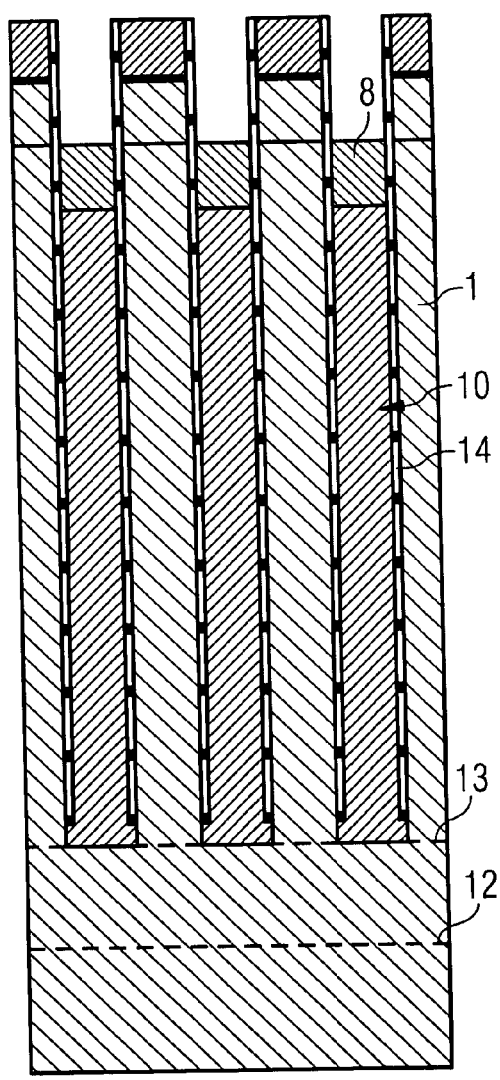

FIG. 3c illustrates the second depth 12 of the second trenches 5, which reveals that the first depth 13 of the first trenches 10 is smaller. That is to say, the latter are not etched in as deeply as the second trenches 5.

A second liner 14 made of silicon oxide is subsequently applied, into the first trenches 10, to the areas of the first trenches 10, as illustrated in FIG. 3c.

The second liner 14 is opened, i.e., partially removed, at the underside of the first trenches 10 by means of a dry etching or a selective silicon oxide etching taken through a previous arsenic doping.

Figure 4A:
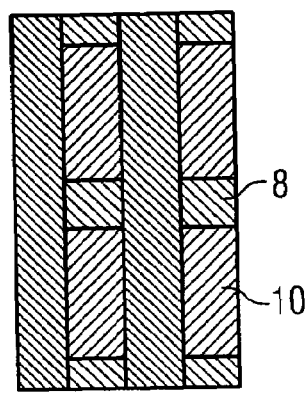
Figure 4B:
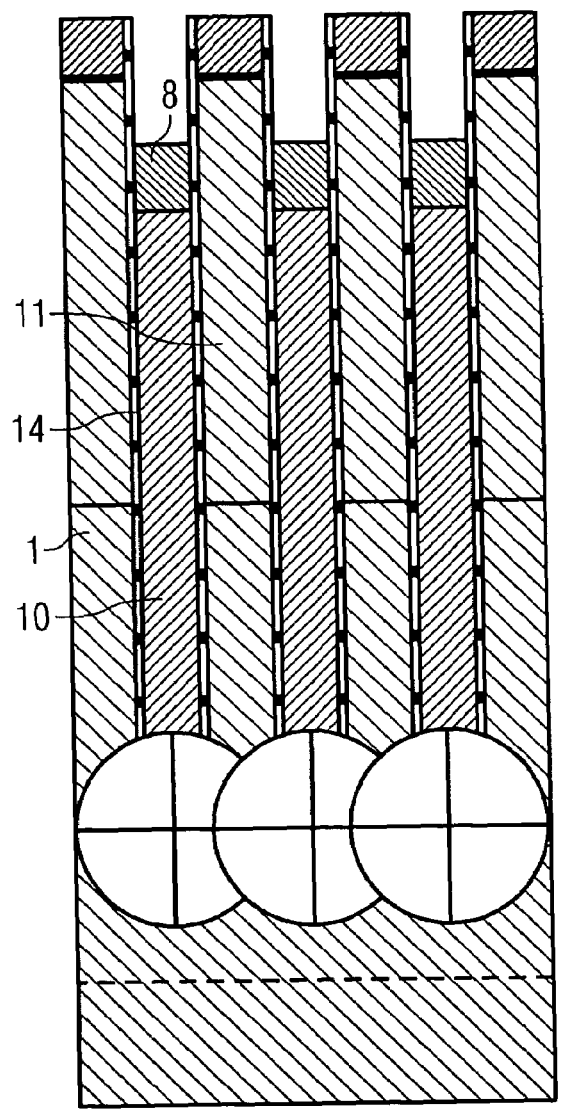
Figure 4C:
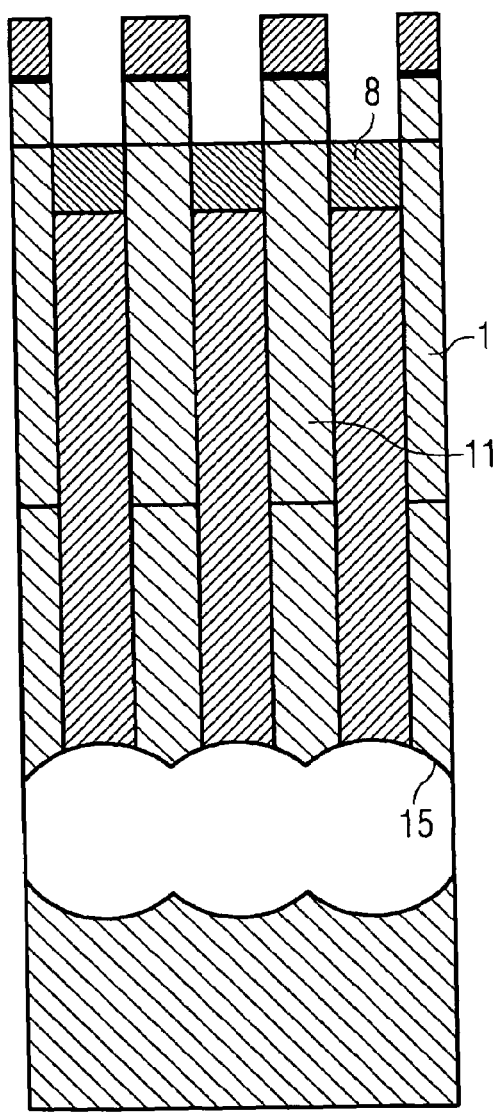

As illustrated in FIG. 4, by means of an isotropic or anisotropic etching step, all the first trenches 10 are subsequently etched through at their underside to their respectively adjacent first trenches 10. The second liner 14 has now fulfilled its task and is removed, as is illustrated in FIG. 4c.

Figure 6A:
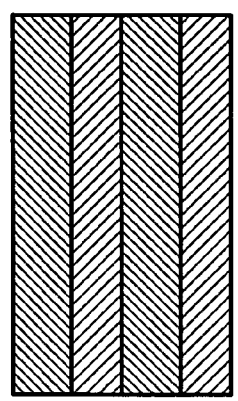
Figure 6B:
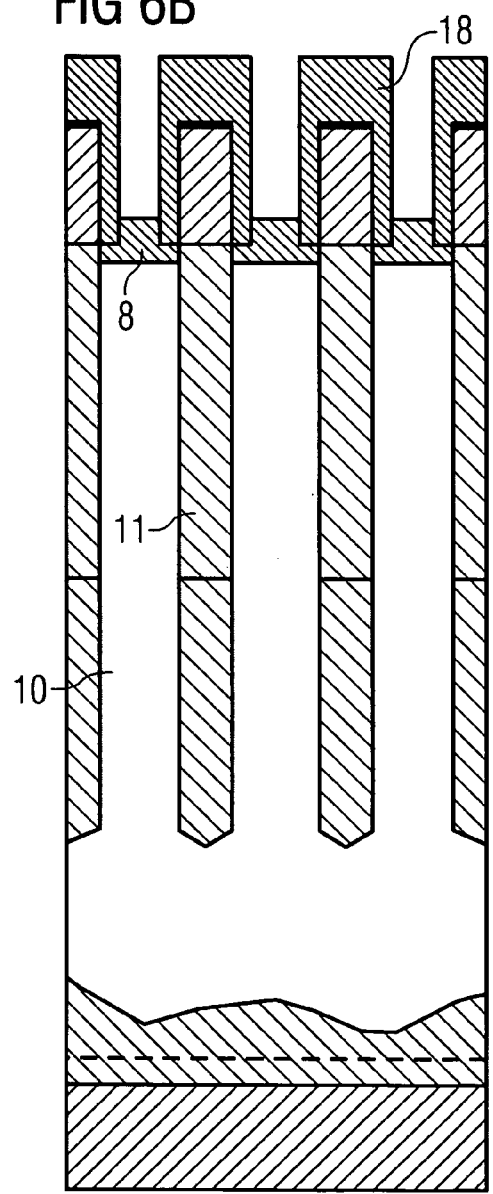

As shown in FIG. 5, third liners 16 made of silicon nitride are now applied to areas of the webs 11, which, after all, now have an uncovered underside 15. The liners 16 serve as an etching stop for later etching steps. For the purpose of fabricating a diffusion barrier in order to protect the channel region of the FET on the top side of the webs 11, it is now necessary to reinforce the silicon nitride layer of the third liner 16 in the region of the top side of the webs 11. For this purpose, the first trenches 10 are filled with polysilicon 17 and etched back, the reinforcement 18 of the silicon nitride layer is applied and the polysilicon 17 is removed again from the first trenches 10, as is illustrated in FIG. 6b.

The third liner 16 is subsequently removed, and although the silicon nitride layer is weakened in the upper region of the webs, it is nonetheless preserved due to the reinforcement 18.

Afterward, the silicon of the webs 11, with the exception of the upper regions protected by the reinforcement 18, is highly doped with arsenic or phosphorus in a gas phase doping. The material of each web 11 can now serve as electrode for the memory node.

Figure 6C:
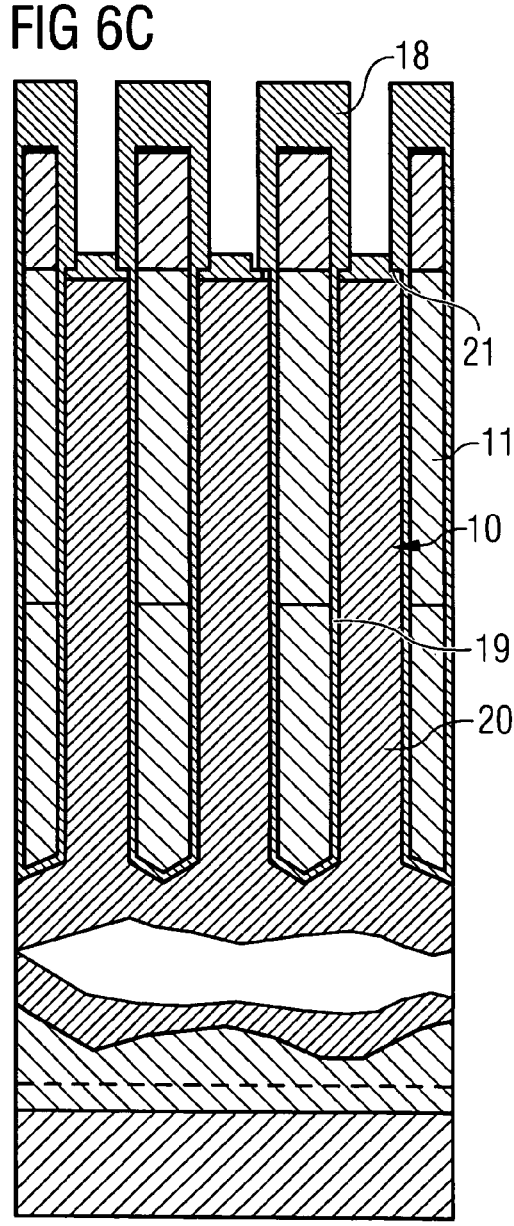

A silicon nitride layer 19 is subsequently deposited onto the highly doped web 11, which layer serves as a later dielectric for the capacitor. The first trenches 10 are then filled with highly doped polysilicon 20 in an LPCVD process, which polysilicon later constitutes the common counterelectrode. The capacitor has thus been fabricated, as is illustrated in FIG. 6c.

Figure 7A:
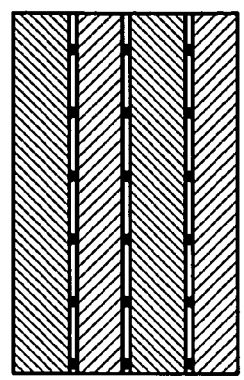
Figure 7B:
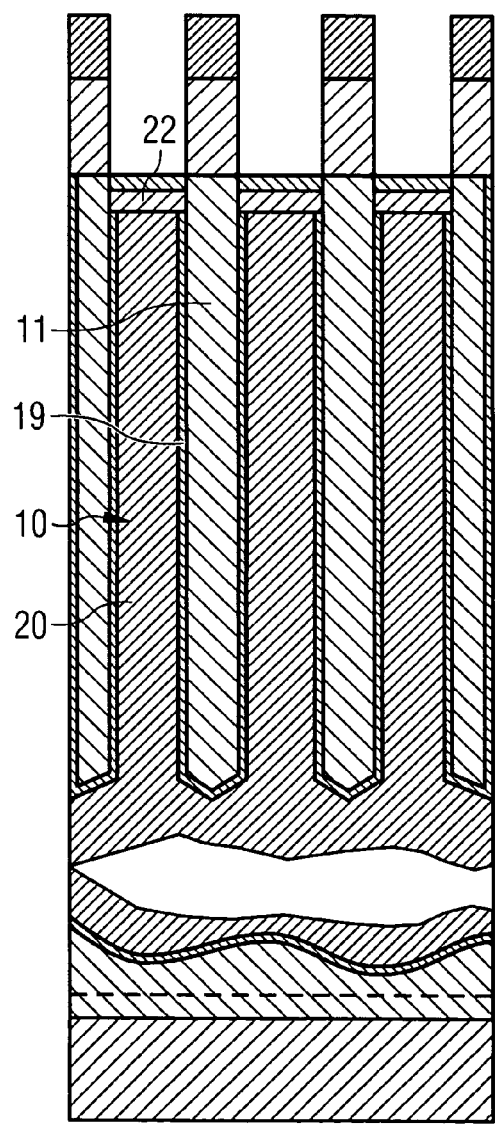
Figure 7C:
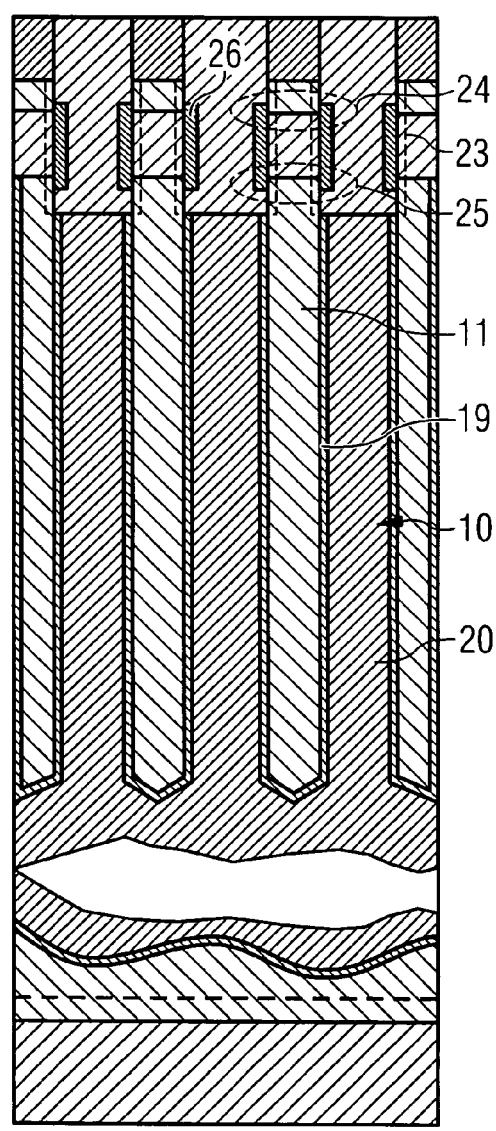

In accordance with FIG. 7, the polysilicon 20 is then etched back as far as the lower edge 21 of the reinforcement 18, in order to remove the reinforcement 18. It is then possible to construct a vertical FET on the top side of the webs 11. For this purpose, the deposition of a trench top side oxide 22 on the filling of the polysilicon 20 is followed by a deposition or growth of a gate oxide 23 made of silicon oxide for the FET to be produced at the upper parts of sidewalls of the webs 11. After a doping of the top side of a respective web 11, the upper source/drain region 24 is realized. A lower source/drain region 25 exists between the undoped and the doped lower part of the web 11.

Figure 8A:
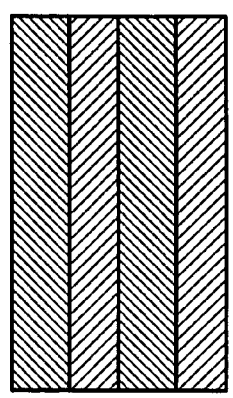
Figure 8B:
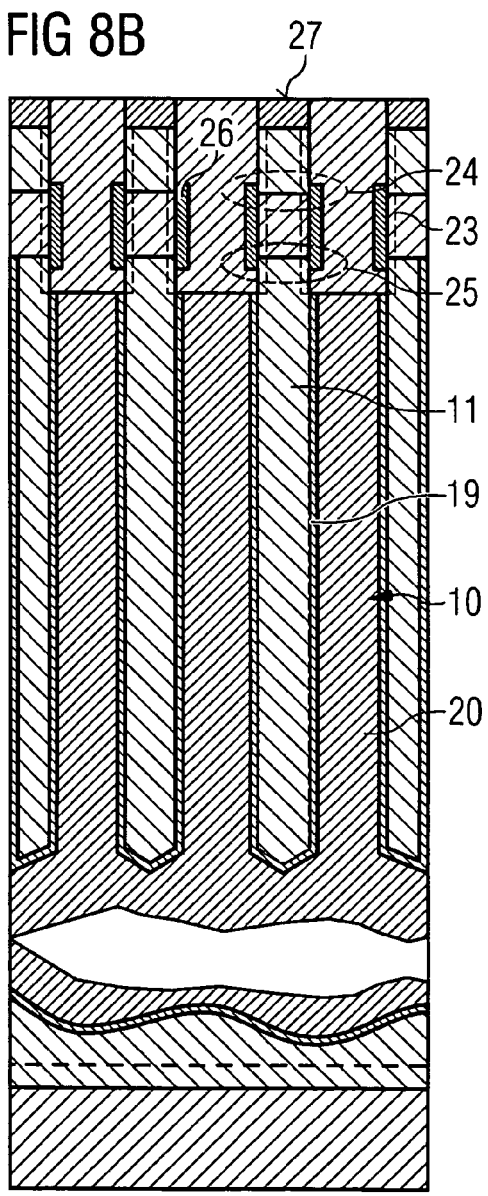

A gate connector 26 made of electrically conductive material, such as highly doped silicon or metal, is applied to the gate oxide 23. Afterward the upper region is filled with silicon oxide and the top side 27 is polished, as is illustrated in FIG. 8b. The gate connectors 26 now serve as word lines, in which case a special contact-connection to external word lines can be obviated since, as a result of the second strip lithography, the gate connectors 26 can be embodied as continuous word lines.

Figure 8C:
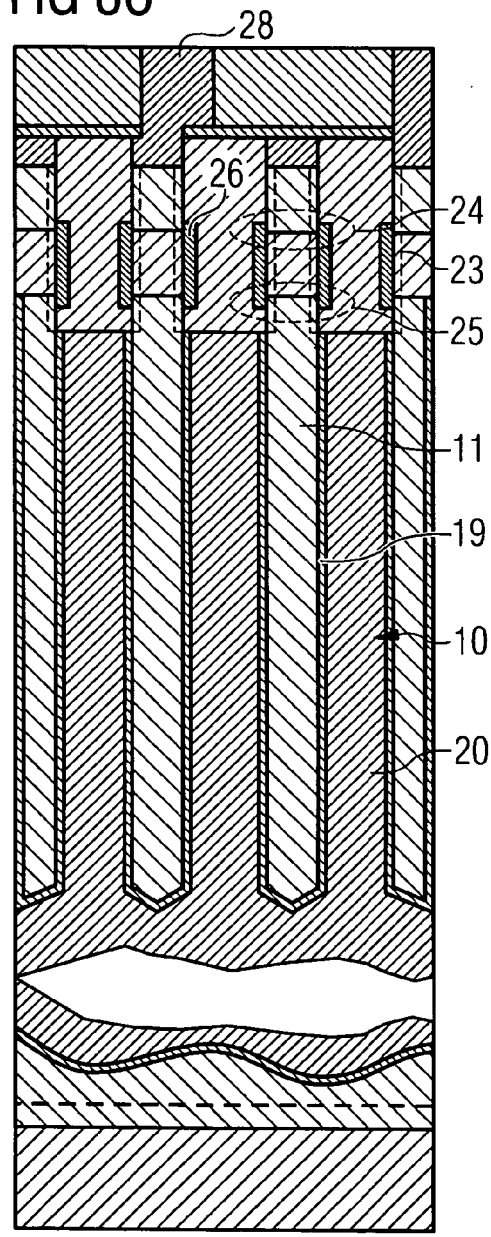

The lower source/drain regions 25 of the FETs are then connected to the respective web 11 serving as memory node. As is illustrated in FIG. 8c, the upper source/drain regions 24 are contact-connected in a customary manner to bit lines 28 applied to the polished top side 27.

Although the present invention and its advantages have been described in detail, it should be understood that various changes, substitutions and alterations can be made herein without departing from the spirit and scope of the invention as defined by the appended claims.

What is claimed is:

1. A method for fabricating a memory cell of a memory cell array in a semiconductor memory, in which a capacitor with one electrode as memory cell node and a second electrode as common counterelectrode of the memory cell array is formed in a semiconductor substrate and a field-effect transistor (FET) is produced above the capacitor, which transistor is connected to the memory cell node of the capacitor, to a word line and to a bit line, the method comprising:

etching two first trenches in the semiconductor substrate, the two trenches running parallel to one another and having a first depth, wherein a web is formed between the two trenches, the web being made of the material of the semiconductor substrate and including two long sides that run perpendicularly to the substrate surface, wherein the web is connected at least indirectly to the semiconductor substrate at narrow sides located between the long sides;

severing the web at its underside such that the web is separated from the semiconductor substrate;

providing the web with a closed dielectric at its two long sides and at its underside;

filling the first trenches with a semiconductor material;

forming a field effect transistor (FET) at a top side of the web or above the web such that the FET is connected to the web at a memory node;

forming a word line and a bit line such that the word line and the bit line are each contact-connected with the FET.

2. The method of claim 1 wherein the web is electrically insulated from the semiconductor substrate at its narrow sides.

3. The method of claim 1 wherein forming an FET comprises forming a vertical FET.

4. The method of claim 1 and further comprising forming an electrical insulation at the narrow sides of the web, wherein the electrical insulation is fabricated by etching, transversely with respect to the first trenches, second trenches that form the narrow sides of the web, the second trenches being etched to a second depth that is at least equal to the first depth, the second trenches being provided with an electrically insulating layer at least at the narrow sides of the web and subsequently being filled.

5. The method of claim 4 wherein the second depth is deeper than the first depth.

6. The method of claim 4 wherein the second trenches are etched before the etching of the first trenches.

7. The method of claim 6 wherein, after the etching of the second trenches, areas of the second trenches are provided with a silicon oxide layer that is thin relative to the width of the second trenches, and the second trenches are subsequently filled with a doped polysilicon.

8. The method of claim 6 wherein, after the etching of the first trenches, silicon oxide is deposited on the inner sides thereof, said silicon oxide subsequently being removed in a lower region of the first trenches and then an etching operation being performed that undercuts the first trenches in the region of the removed silicon oxide layer and connects the first trenches to one another below the web.

9. The method of claim 1 wherein the semiconductor substrate comprises silicon.

10. A method of fabricating a memory device, the method comprising:

forming a web of semiconductor islands by etching a plurality of first trenches in a semiconductor substrate and etching a plurality of second trenches in the semiconductor substrate across the plurality of first trenches;

filling at least an upper portion of the first and second trenches;

etching an underside of the semiconductor substrate beneath the web of semiconductor islands;

forming a dielectric material beneath the web of semiconductor islands;

forming transistor devices at a top side of the web.

11. The method of claim 10 wherein lower portions of the first and second trenches are filled with a conductive material.

12. The method of claim 11 wherein the conductive material comprises polysilicon.

13. The method of claim 10 wherein forming transistor devices comprises forming transistor devices such that each transistor device is electrically coupled to a capacitor.

14. The method of claim 13 wherein each capacitor is formed beneath its respect transistor device.

15. The method of claim 14 wherein forming transistor devices comprises forming vertical field effect transistors.

16. The method of claim 10 wherein the semiconductor substrate comprises silicon.

17. A method for fabricating a memory cell of a memory cell array in a semiconductor memory, in which a capacitor with one electrode as memory cell node and a second electrode as common counterelectrode of the memory cell array is formed in a semiconductor substrate and then a field-effect transistor (FET) is produced above the capacitor, which transistor is connected to the memory cell node of the capacitor, to a word line and to a bit line, wherein:

two first trenches running parallel and having a first depth are etched in the semiconductor substrate, between which trenches is formed a web made of the material of the semiconductor substrate with two long sides that run perpendicularly to the substrate surface, which web is connected at least indirectly to the semiconductor substrate at its narrow sides located between the long sides, afterward the web is severed at its underside and separated from the semiconductor substrate, afterward the web is provided with a closed dielectric at its two long sides and at its now free underside, afterward the first trenches are filled with semiconductor material, afterward the FET is applied at the top side of the web or above the web and is connected to the web as memory node, afterward the word and bit lines are applied with the FET being contact-connected, and before one of the above-mentioned process steps, the web is electrically insulated from the semiconductor substrate at its narrow sides.

18. The method of claim 17, wherein the electrical insulation of the web at the narrow sides is fabricated by etching, transversely with respect to the first trenches, second trenches, which form the narrow sides of the web, with a second depth, which are provided with an electrically insulating layer at least at the narrow sides of the web and are subsequently filled, the second depth being at least equal to the first depth.

19. The method of claim 17 wherein the semiconductor substrate is composed of silicon and wherein, after the etching of the second trenches, the areas of the second trenches are provided with a silicon oxide layer that is thin relative to the width of the second trenches, and the second trenches are subsequently filled with a doped polysilicon.

20. The method of claim 17 wherein the semiconductor substrate is composed of silicon and wherein, after the etching of the first trenches, silicon oxide is deposited on the inner sides thereof, which silicon oxide is subsequently removed again in the lower region of the first trenches and then an etching operation is performed which undercuts the first trenches in the region of the removed silicon oxide layer and connects the first trenches to one another below the web.

* * * * *